United States Patent
Kurihara et al.

(10) Patent No.: US 6,943,286 B1
(45) Date of Patent: Sep. 13, 2005

(54) ELECTROMAGNETIC WAVE ABSORBER MOLDING MATERIAL, ELECTROMAGNETIC WAVE ABSORBER MOLDED ELEMENT AND METHOD OF MANUFACTURING SAME, AND ELECTROMAGNETIC WAVE ABSORBER

(75) Inventors: Hiroshi Kurihara, Tokyo (JP); Motonari Yanagawa, Tokyo (JP); Kozo Hayashi, Gifu (JP); Kyoichi Fujimoto, Gifu (JP); Hideki Kishino, Gifu (JP)

(73) Assignee: TDK Corporation, Tokyo (JP)

( * ) Notice: Subject to any disclaimer, the term of this patent is extended or adjusted under 35 U.S.C. 154(b) by 85 days.

(21) Appl. No.: 10/628,386

(22) Filed: Jul. 29, 2003

(30) Foreign Application Priority Data

Mar. 26, 2003 (JP) ........................................ 2003-086210

(51) Int. Cl.⁷ ................................................ H05K 9/00
(52) U.S. Cl. ................................. 174/35 MS; 428/323; 342/4
(58) Field of Search ........................ 174/35 MS, 35 R; 361/816, 818; 428/323; 342/4

(56) References Cited

U.S. PATENT DOCUMENTS

| 5,304,750 A | * | 4/1994 | Schubert et al. ............. 181/294 |
| 6,214,454 B1 | * | 4/2001 | Kanda et al. ............. 428/294.7 |
| 6,373,425 B1 | | 4/2002 | Inoue et al. .................... 342/1 |

FOREIGN PATENT DOCUMENTS

| JP | B1 3041295 | | 3/2000 | |
| JP | 02000269680 A | * | 9/2000 | ............. H05K/9/00 |
| JP | A 2002-176286 | | 6/2002 | |

* cited by examiner

*Primary Examiner*—Hung V. Ngo
(74) *Attorney, Agent, or Firm*—Oliff & Berridge, PLC

(57) ABSTRACT

An electromagnetic wave absorber comprises an electromagnetic wave absorber molded element, plate-shaped sintered ferrite, and a metal plate. The molded element incorporates a tile-shaped base portion and a wedge-shaped apex portion disposed on the base portion. The molded element is formed by injecting slurry into a mold, the slurry being obtained through mixing a molding material for the wave absorber with water, and curing the slurry. The molding material includes a magnetic material, an inorganic fiber and an inorganic binder. When these ingredients are mixed with water, the molding material first exhibits fluidity and then a curing reaction in a temperature range of 1 to 40° C.

28 Claims, 7 Drawing Sheets

ELECTROMAGNETIC WAVE ABSORBER MOLDING MATERIAL, ELECTROMAGNETIC WAVE ABSORBER MOLDED ELEMENT AND METHOD OF MANUFACTURING SAME, AND ELECTROMAGNETIC WAVE ABSORBER

BACKGROUND OF THE INVENTION

1. Field of the Invention

The present invention relates to an electromagnetic wave absorber molding material used for forming a molded element making up at least part of an electromagnetic wave absorber, a wave absorber molded element made of the molding material and a method of manufacturing the molded element, and to the electromagnetic wave absorber including the molded element.

2. Description of the Related Art

It has been commonly practiced to test electromagnetic compatibility (EMC) of a variety of types of instruments in anechoic chambers. The standards concerning EMC define permissible levels and testing methods to comply with for electromagnetic waves generated by the instruments. International standard organizations that establish the standards relating to the EMC include the TC77 and the CISPR that belong to the International Electrotechnical Commission (IEC). These organizations have made basic standards and common standards relating to the EMC.

The site attenuation measurement is used to evaluate the capability of anechoic chambers required for measuring and evaluating emission (of electromagnetic energy). According to the standard CISPR22 and the standard ANSI C63.4, the normalized site attenuation is used to define the conditions for the capability required for the anechoic chambers. To be specific, the required capability of the chambers is that the measured value of the site attenuation falls within the theoretical site attenuation value plus or minus 4 dB.

The electric field uniformity measurement is used to evaluate the capability of the anechoic chamber required for measuring and evaluating immunity (the capability of eliminating electromagnetic interference). It is common that the anechoic chamber has a metal floor since measurement and evaluation of emission are also performed in the chamber in many cases. An electromagnetic wave absorber is placed on the metal floor when immunity is measured and evaluated in such an anechoic chamber.

With regard to an immunity test of emission of electromagnetic waves having a frequency of 1 GHz or lower, the electric field uniformity required for the anechoic chamber is that, in 75 percent of grid-shaped 16 points arranged in a window of 1.5 meters by 1.5 meters, that is, in 12 points, the electric field intensity falls within the range of –0 dB to 6 dB of the test field intensity. A testing method for digital cellular phones has been recently added to the standard IEC61000-4-3 that requires the field uniformity for the anechoic chamber at frequencies up to 2 GHz.

A composite electromagnetic wave absorber made up of a combination of ferrite tiles and a dielectric loss material is one of wave absorbers used for the anechoic chamber intended for EMC testing. The composite wave absorber was first employed in the anechoic chamber of the Radio Research Laboratory of the Ministry of Posts and Telecommunications of Japan in 1969. This type of composite wave absorber is the dominating wave absorber used for the anechoic chamber intended for EMC testing.

The conventional composite wave absorber implements an electromagnetic wave absorbing capability in a wide band, taking advantage of features of each of the ferrite tiles and the dielectric loss material. The composite wave absorber is designed such that the ferrite tiles efficiently absorb waves in a low-frequency region around 30 MHz to 500 MHz and that the dielectric loss material efficiently absorb waves in a high-frequency region of 500 MHz and higher. The ferrite tiles are plate-shaped sintered ferrite. Ferrite used for the ferrite tiles is mainly Ni—Cu—Zn or Ni—Zn ferrite. The tiles have a thickness around 4 to 7 millimeters (mm). The dielectric loss material is mainly a, conductive material such as carbon mixed or soaked in a foam. The dielectric loss material utilized has a length around 45 to 250 centimeters (cm), the length being orthogonal to the ferrite tile surface.

A composite electromagnetic wave absorber made up of a combination of ferrite tiles and a dielectric loss material has been practically utilized as a wave absorber used for immunity testing in a wide range from a frequency as low as 26 MHz to a frequency higher than 1 GHz. A composite wave absorber made up of a combination of ferrite tiles and a magnetic loss material as disclosed in the Japanese Patent No. 3041295 has been recently brought to practical use, too. This wave absorber has a length around 10 cm, the length being orthogonal to the ferrite tile surface.

A non-flammable electromagnetic wave absorbing sheet and a wave absorbing structure made of the sheet are disclosed in Published Unexamined Japanese Patent Application 2002-176286.

It is preferred that wave absorbers used for the anechoic chamber is non-flammable. Non-flammable wave absorbers have been practically utilized for the anechoic chamber intended for EMC testing. The non-flammable wave absorbers incorporate a dielectric loss:material such as one made of a conductive material mixed in an inorganic material, or one made of a flat plate-shaped or honeycomb-shaped structure of an inorganic material to which a conductive material is applied or in which a conductive material is soaked.

However, this type of wave absorber incorporates the dielectric loss material so that it is required that the absorber have a length of at least around 45 cm. Therefore, the problem is that it is not preferred in some cases to place this wave absorber in a limited space such as a small acechoic chamber, in particular.

On the other hand, the composite wave absorber disclosed in the Japanese Patent No. 3041295 incorporates the magnetic loss material made up of an organic material in which a magnetic loss material is mixed or soaked. Therefore, this type of composite wave absorber does not exhibit excellent non-flammability and it is not suitable for use in the anechoic chamber for safety reasons.

The wave absorbing structure using the non-flammable wave absorbing sheet disclosed in Published Unexamined Japanese Patent Application 2002-176286 is honeycomb-shaped or corrugated. However, the wave absorbing structure using the non-flammable wave absorbing sheet has a problem that the manufacture of the structure requires a number of steps. For example, the honeycomb-shaped structure is fabricated as follows. First, the non-flammable wave absorbing sheets are formed. Next, a plurality of sheets are stacked while portions of adjacent ones of the sheets are bonded to each other to form a laminate. The laminate is then expanded.

OBJECT AND SUMMARY OF THE INVENTION

It is an object of the invention to provide an electromagnetic wave absorber molding material, an electromagnetic wave absorber molded element and a method of manufacturing the same, and an electromagnetic wave absorber that achieves the manufacture of non-flammable and small-sized wave absorber with ease.

An electromagnetic wave absorber molding material of the invention is used for making a molded element making up at least part of an electromagnetic wave absorber. The molding material includes a magnetic material, an inorganic fiber and an inorganic binder. When the magnetic material, the inorganic fiber and the inorganic binder are mixed with water, the molding material first exhibits fluidity and then a curing reaction in a temperature range of approximately 1 to 40° C. inclusive.

According to the molding material of the invention, the molding material is mixed with water to be in a fluid state and injected into a mold to cure. It is thereby possible to easily manufacture the wave absorber molded element that is non-flammable and small-sized.

According to the molding material of the invention, the inorganic binder may include soluble alkaline silicate and zinc borate. The proportion of the inorganic binder in the molding material may fall within a range of approximately 8.0 to 13.0 weight % inclusive.

According to the molding material of the invention, the inorganic fiber may have a length in a range of approximately 20 to 150 μm inclusive, and the proportion of the inorganic fiber in the molding material may fall within a range of approximately 2.0 to 7.0 weight % inclusive.

According to the molding material of the invention, the proportion of the magnetic material in the molding material may fall within a range of approximately 80 to 90 weight % inclusive.

An electromagnetic wave absorber molded element of the invention is a molded element making up at least part of a wave absorber and made of the molding material of the invention.

The molded element of the invention may have such a shape that the proportion of the molded element occupying a space of unit volume increases from a wave-incident-side end of the element to the other end. In this case, the molded element may be wedge-shaped or pyramid-shaped.

A method of manufacturing an electromagnetic wave absorber molded element of the invention comprises the steps of injecting slurry into a mold, the slurry being obtained through mixing the molding material of the invention with water; curing the slurry injected into the mold to form the molded element of the invention; and taking the molded element out of the mold.

An electromagnetic wave absorber of the invention comprises: the wave absorber molded element of the invention; a plate-shaped wave absorbing section having surfaces one of which is located adjacent to an end of the molded element opposite to a wave-incident side; and a wave reflector located adjacent to the other one of the surfaces of the wave absorbing section. The wave absorbing section may be made of sintered ferrite.

Other and further objects, features and advantages of the invention will appear more fully from the following description.

DETAILED DESCRIPTION OF THE PREFERRED EMBODIMENT

Figure 1:
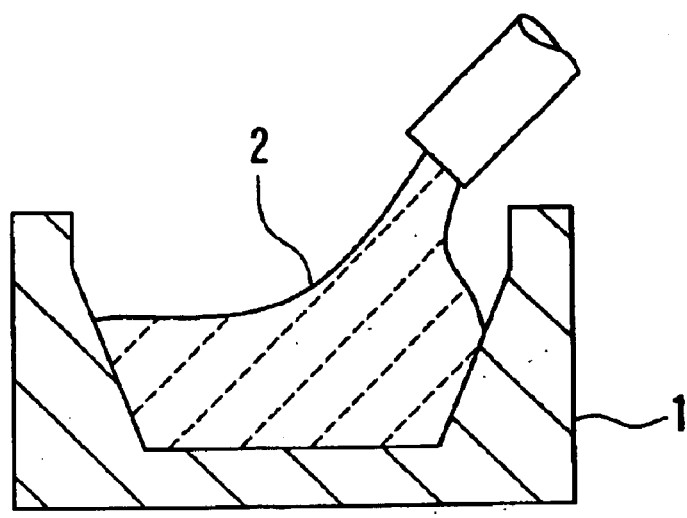
FIG. 1 is a cross-sectional view for illustrating a step of manufacturing an electromagnetic wave absorber molded element of an embodiment of the invention.

A preferred embodiment of the invention will now be described in detail with reference to the accompanying drawings.

[Electromagnetic Wave Absorber Molding Material]

An electromagnetic wave absorber molding material of an embodiment of the invention will now be described. The material is used for making a molded element making up at least part of an electromagnetic wave absorber. The material includes a magnetic material, inorganic fibers and an inorganic binder. When these ingredients are mixed with water, the molding material first exhibits fluidity and then a curing reaction in a temperature range of 1 to 40° C. inclusive.

The magnetic material utilized may be ferrite powder, for example. The proportion of the magnetic material in the wave absorber molding material preferably falls within a range of 80 to 90 weight % inclusive.

The inorganic fibers are fibers made of an inorganic material. Such an inorganic material may be rock wool, glass fibers, silica fibers or alumina fibers. The length of each of the inorganic fibers preferably falls within a range of 20 to 150 μm inclusive. The proportion of the inorganic fibers in the wave absorber molding material preferably falls within a range of 2.0 to 7.0 weight % inclusive.

The inorganic binder is a binder made of an inorganic material. The inorganic binder may include soluble alkaline silicate and zinc borate, for example. The proportion of the inorganic binder in the wave absorber molding material preferably falls within a range of 8.0 to 13.0 weight % inclusive.

The following is a description of an example of the electromagnetic wave absorber molding material of the embodiment and a method of manufacturing the same. The wave absorber molding material is manufactured as follows. Ferrite powder as the magnetic material, inorganic fibers, an inorganic binder and water are stirred, mixed and kneaded to form slurry having fluidity. The inorganic binder includes soluble alkaline silicate and zinc borate.

The proportion of the ferrite powder in the wave absorber molding material is adjusted so that the wave absorber made of the material has a desired wave absorbing capability. To increase the amount of the ferrite powder in the material per specific volume, the amounts of the inorganic fibers and the inorganic binder per specific volume are reduced. In contrast, to decrease the amount of the ferrite powder in the material per specific volume, the amounts of the inorganic fibers and the inorganic binder per specific volume are increased.

To fabricate the wave absorber molded element using the molding material, the above-mentioned slurry is injected into a mold and cured, which will be described later. The amount of water the slurry contains is adjusted so that the viscosity of the slurry is suitable for injecting the slurry into the mold.

The above-mentioned curing of the slurry is achieved by a curing reaction of the inorganic binder in a temperature range of 1 to 40° C. inclusive. The curing reaction of the inorganic binder is caused by a reaction between soluble alkaline silicate and zinc borate. The curing reaction will now be described in detail. The solubility of the silicate in water is low. Although silicate except alkaline silicate is hard to dissolve in water, some types of alkaline silicate are soluble, that is, soluble alkaline silicate. In the present example potassium silicate is used as soluble alkaline silicate. The potassium silicate is mixed with water to obtain an aqueous solution of potassium silicate. Zinc borate is obtained by heating boric acid and zinc to compound. The zinc borate thus obtained is slowly dissolved in the above-mentioned aqueous solution of potassium silicate to be boric acid and zinc. The boric acid and zinc then react with potassium in the solution of potassium silicate and fix the potassium. As a result, silica in the solution of potassium silicate aggregates. Consequently, the viscosity of the slurry slowly starts to increase after a specific period of time has passed since the above-mentioned reaction started, and the viscosity suddenly increases at a specific point. As a result, silicate aggregates and the slurry loses fluidity and gets cured finally. A solid insoluble in water is thereby obtained.

For example, the slurry at a room temperature (15° C.) exhibits a low rate of increase in viscosity until thirty minutes after the slurry is injected into the mold. The slurry is cured after one hour and starts to shrink after two hours or more.

The inorganic fibers in the wave absorber molding material have a surface hydrophilic property and are used for preventing the materials in the molded element from separating. That is, the inorganic fibers enter the spaces among the ferrite particles in the slurry and prevent the ferrite particles from being in close contact with one another. It is thereby possible to prevent the inorganic binder and the ferrite from staying in an upper portion or a lower portion and being separated from each other.

The length of each of the inorganic fibers is determined such that the fibers prevent the inorganic binder and the ferrite from being separated from each other and that an appropriate viscosity of the slurry is obtained. The length of each of the fibers preferably falls within the range of 20 to 150 $\mu$m inclusive. In the example of the invention the length is 75 $\mu$m. If the length is greater than 150 $\mu$m, the fibers could be tilted in the horizontal direction or curved fibers could be entangled and cause clusters of the fibers. The separation of the inorganic binder from the ferrite thereby results. If the length of each fiber is smaller than 20 $\mu$m, the viscosity of the slurry could increase. In addition, if the length is smaller than 20 $\mu$m, the thixotropy of the slurry could increase and it could be difficult that the slurry is injected in the mold through a natural flow. That is, if such a slurry is injected in the mold, the flow of the slurry is insufficient so that it is impossible that the slurry completely substitutes for the air in the mold and the slurry thereby contains a lot of bubbles.

The proportion of the inorganic fibers in the wave absorber molding material is also determined such that the fibers prevent the inorganic binder and the ferrite from being separated from each other and that an appropriate viscosity of the slurry is obtained. From this point of view, the proportion of the fibers in the wave absorber molding material preferably falls within the range of 2.0 to 7.0 weight % inclusive, and more preferably 3.0 to 5.0 weight % inclusive.

Although it is possible that the inorganic fibers prevent the inorganic binder and the ferrite from being separated from each other as described above, the separation of the binder from the ferrite due to the difference in specific gravity is inevitable if the slurry is left for a long time. It is thus desirable that the viscosity of the slurry quickly increases after the slurry is injected into the mold. In the example the inorganic binder utilized is of a type that contains two components of soluble potassium silicate and zinc borate and that requires no processing such as heating for curing. In addition, the binder is such a binder that the viscosity thereof quickly increases after a lapse of about 30 minutes after the slurry is injected in the mold. It is thereby possible to prevent the separation of the binder from the ferrite.

According to the wave absorber molding material of the embodiment, the material is mixed with water to have fluidity and injected into the mold and cured, so that the wave absorber molded element that is made up of only the inorganic materials, non-flammable and small-sized is easily manufactured.

[Electromagnetic Wave Absorber Molded Element and Method of Manufacturing Same]

Figure 2:
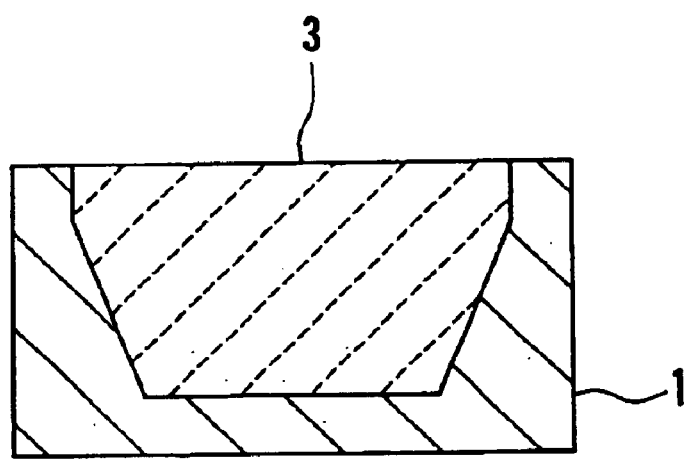
FIG. 2 is a cross-sectional view for illustrating a step that follows the step of FIG. 1.
Figure 3:
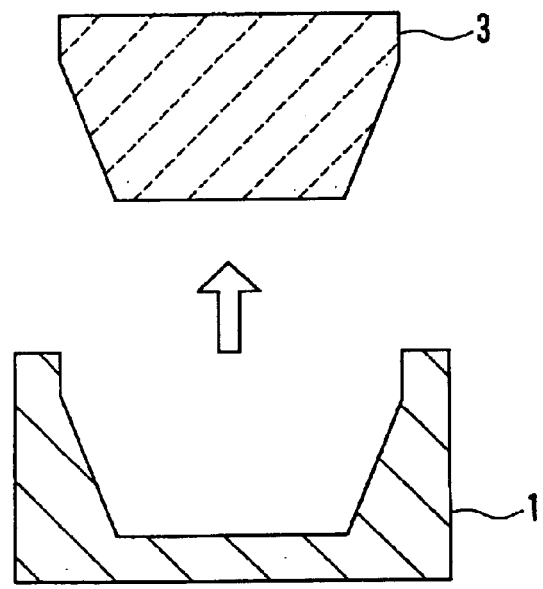
FIG. 3 is a cross-sectional view for illustrating a step that follows the step of FIG. 2.

The following are descriptions of an electromagnetic wave absorber molded element and a method of manufacturing the same of the embodiment of the invention. FIG. 1 to FIG. 3 are cross sectional views for illustrating the steps of the method of manufacturing the wave absorber molded element of the embodiment. The wave absorber molded element is a molded element making up at least part of an electromagnetic wave absorber, and made of the electromagnetic wave absorber molding material of the embodiment. The molded element absorbs electromagnetic waves through the use of magnetic loss of the magnetic material.

According to the method of manufacturing the wave absorber molded element of the embodiment, as shown in FIG. 1, slurry 2 is injected into a mold 1, the slurry 2 being made of a mixture of water and the wave absorber molding material of the embodiment. The mold 1 has a cavity that corresponds to the shape of the wave absorber molded element to be formed. Next, as shown in FIG. 2, the slurry 2 injected into the mold 1 is cured at a temperature of 1 to 40° C. to form a wave absorber molded element 3. Next, the molded element 3 is taken out of the mold 1, as shown in FIG. 3.

A white coating, for example, may be applied to a surface of the wave. absorber molded element of the embodiment. The molded element has a porous structure and thereby exhibits a good surface wettability. It is therefore possible to apply coating to the surface thereof easily.

The following is a description of an example of the wave absorber molded element and the method of manufacturing the same of the embodiment. In the example four types of wave absorber molding materials having mix proportions 1 to 4 were made.

TABLE 1

|  | Proportion 1 | Proportion 2 | Proportion 3 | Proportion 4 |
|---|---|---|---|---|
| Ferrite powder | 80 weight % | 85 weight % | 88 weight % | 90 weight % |
| Inorganic binder | 13 weight % | 10 weight % | 9 weight % | 8 weight % |
| Inorganic fibers | 7 weight % | 5 weight % | 3 weight % | 2 weight % |

In the example the above-mentioned four types of wave absorber molding materials were then utilized to form four specimens each having dimensions of 100 by 100 by 10 mm. Next, a bending strength test was performed on each of the four specimens, based on section 1.9 of the standard JISA5209. The JISA5209 defines the bending strength of a tile used for furnishings wherein a tile used for a wall has a bending breaking load of 1.23 kgf/cm or greater and a tile used for a floor has a bending breaking load of 6.12 kgf/cm or greater. The table below shows the result of the above-mentioned test. The unit of bending strength shown in the table is kgf/cm.

TABLE 2

|  | Proportion 1 | Proportion 2 | Proportion 3 | Proportion 4 |
|---|---|---|---|---|
| Bending strength | 35 | 49 | 43 | 26 |

As shown in the table above, each of the four specimens had a bending strength sufficient for a structure to be furnished or installed. In particular, the specimen made of the molding material having mix proportion 2 and the specimen made of the molding material having mix proportion 3 each had a bending strength of greater than 40 kgf/cm. As the result shows, any of the four types of wave absorber molding materials having mix proportions 1 to 4 is suitable for use in a wave absorber used for an anechoic chamber, in terms of strength. The material having mix proportion 2 or 3 is particularly suitable for use in the wave absorber used for the anechoic chamber.

In particular, it is the proportion of each of the inorganic binder and the inorganic fibers in the wave absorber molding material that contributes to the bending strength. As described above, the proportion of the inorganic fibers in the molding material preferably falls within the range of 2.0 to 7.0 weight % inclusive, and more preferably 3.0 to 5.0 weight % inclusive, in terms of suitability for formation of a molded element. In addition to this point, in terms of the above-mentioned strength, the proportion of the inorganic binder in the molding material preferably falls within the range of 8 to 13 weight % inclusive, and more preferably 9 to 10 weight % inclusive.

Figure 4:
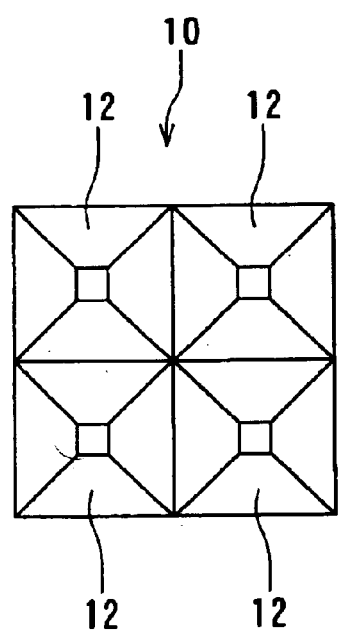
FIG. 4 is a front view of a pyramid-shaped electromagnetic wave absorber molded element of the embodiment of the invention.
Figure 5:
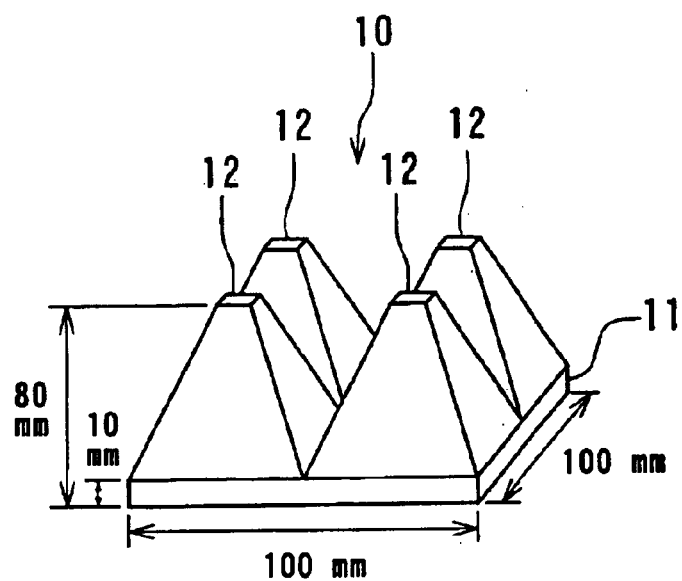
FIG. 5 is a perspective view of the wave absorber molded element of FIG. 4.
Figure 6:
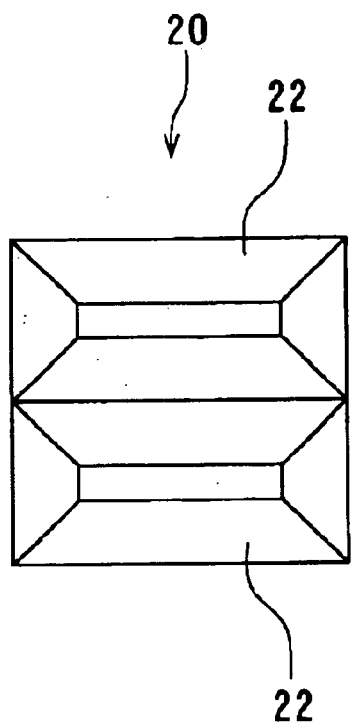
FIG. 6 is a front view of a wedge-shaped electromagnetic wave absorber molded element of the embodiment of the invention.
Figure 7:
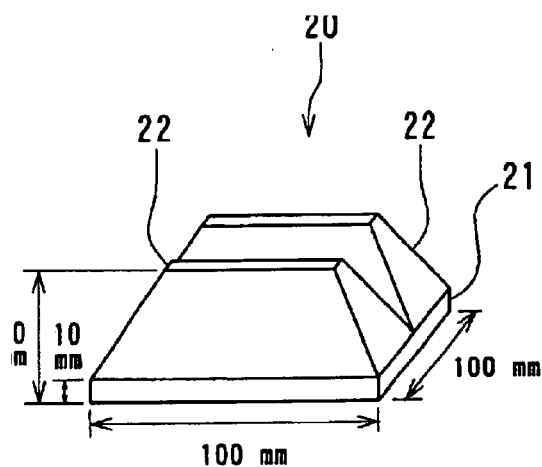
FIG. 7 is a perspective view of the wave absorber molded element of FIG. 6.

Next, an electromagnetic wave absorber molded element to be actually placed in an anechoic chamber was formed, using the wave absorber molding material having mix proportion 1. The wave absorber molded element had such a shape that the proportion of the molded element occupying the space of unit volume increased from a wave-incident-side end of the element to the other end, so that the wave absorber incorporating the molded element would exhibit an excellent wave absorbing capability in a wide band, especially in a high frequency range of 1 to 18 GHz. To be specific, a pyramid-shaped first wave absorber molded element 10 of FIG. 4 and FIG. 5 and a wedge-shaped second wave absorber molded element 20 of FIG. 6 and FIG. 7 were made. FIG. 4 is a front view of the first molded element 10. FIG. 5 is a perspective view of the first molded element 10. FIG. 6 is a front view of the second molded element 20. FIG. 7 is a perspective view of the second molded element 20.

As shown in FIG. 4 and FIG. 5, the first molded element 10 has a base portion 11 shaped like a tile having a length of 100 mm, a width of 100 mm and a thickness of 10 mm, and four pyramid-shaped apex portions 12 mounted on the base portion 11.

As shown in FIG. 6 and FIG. 7, the second molded element 20 has a base portion 21 shaped like a tile having a length of 100 mm, a width of 100 mm and a thickness of 10 mm, and two wedge-shaped apex portions 22 mounted on the base portion 21.

The volume of each of the molded elements 10 and 20 was 360 cc so that the amount of ferrite contained in the elements 10 and 20 would be equal. As a result, the first molded element 10 had a height of 80 mm while the second molded element 20 had a height of 60 mm.

[Electromagnetic Wave Absorber]

The electromagnetic wave absorber of the embodiment will now be described. The wave absorber comprises the wave absorber molded element of the embodiment, a plate-shaped wave absorbing section, and a wave reflector. The wave absorbing section has surfaces one of which is located adjacent to an end of the molded element opposite to the wave-incident side. The wave reflector is located adjacent to the other surface of the wave absorbing section. The wave absorbing section may be made of sintered ferrite. The sintered ferrite converts electromagnetic energy to thermal energy so as to absorb electromagnetic waves through the use of the magnetic resonance loss of ferrite. The wave reflector may be a metal plate, for example.

An example of the wave absorber of the embodiment will now be described. In the example a first wave absorber was made of the first wave absorber molded element 10. A second wave absorber was made of the second wave absorber molded element 20. The first wave absorber comprises the molded element 10, plate-shaped sintered ferrite, and a metal plate. Similarly, the second wave absorber comprises the molded element 20, plate-shaped sintered ferrite, and a metal plate. The sintered ferrite of each of the first and second wave absorbers has a thickness of 6.3 mm.

Figure 8:
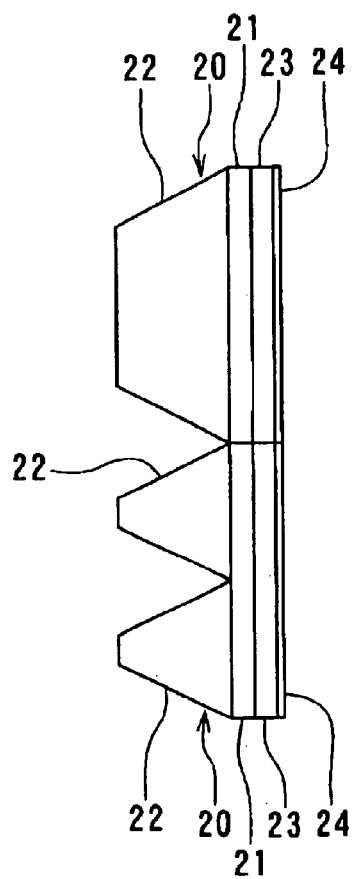
FIG. 8 is a side view of part of wave absorber assembly of the embodiment.
Figure 9:
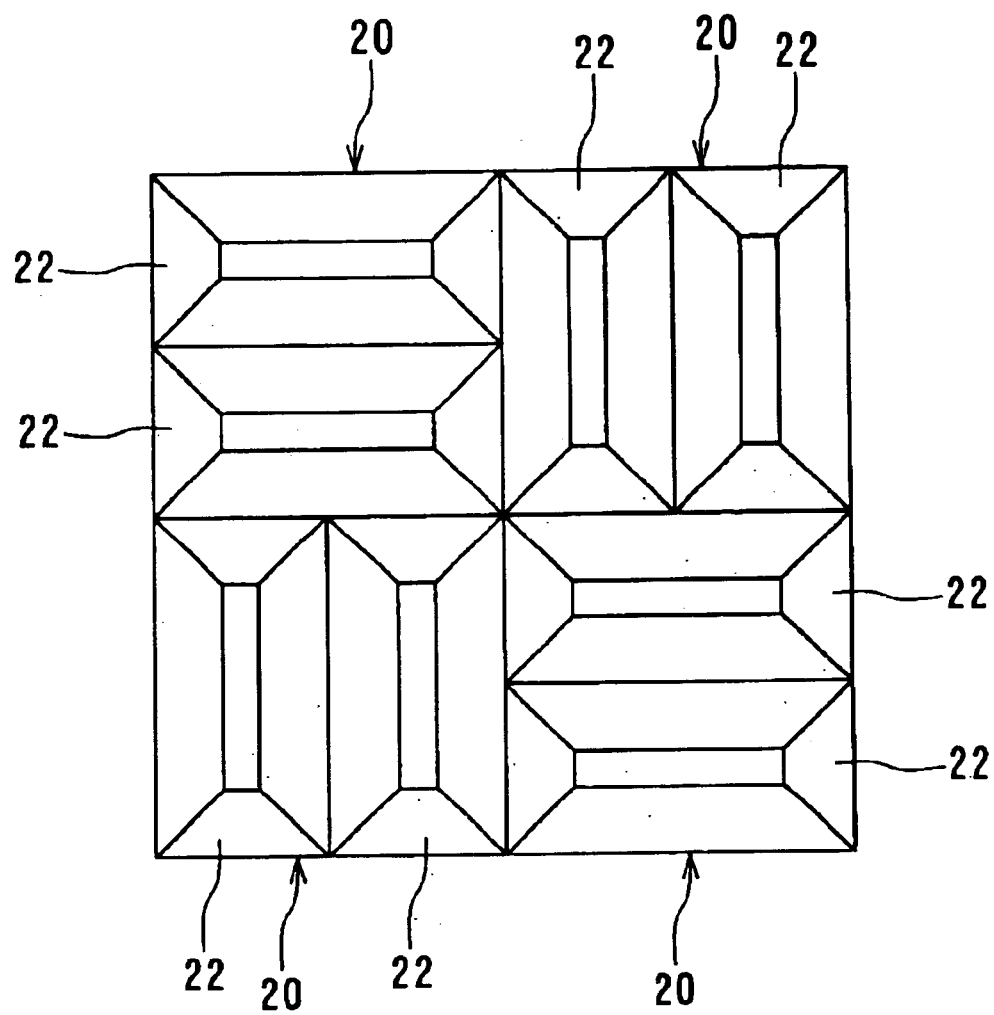
FIG. 9 is a front view of part of the wave absorber assembly of the embodiment.

The wave absorbing capabilities of the first and second wave absorbers were then evaluated. The capability of the first wave absorber was evaluated through the use of a first assembly made up of a plurality of first wave absorbers arranged across the length and width of the metal plate. Similarly, the capability of the second wave absorber was evaluated through the use of a second assembly made up of a plurality of second wave absorbers arranged across the length and width of the metal plate. FIG. 8 is a side view of part of the second assembly. FIG. 9 is a front view of the part of the second assembly. In FIG. 8 numeral 23 indicates the plate-shaped sintered ferrite and numeral 24 indicates the metal plate. As shown in FIG. 8 and FIG. 9, the second wave absorbers of the second assembly were arranged such that the apex portions 22 of adjacent ones of the molded elements 20 had ridges disposed in different directions, so as to prevent anisotropy between the vertical and horizontal directions with respect to the properties concerning electromagnetic waves applied.

The wave absorbing capabilities of the first and second wave absorbers were evaluated in the following manner through the use of a vector network analyzer as an evaluating instrument. An amount of reflected electromagnetic waves of each of the wave reflector and the first and second wave absorbers was measured. The amount of reflected waves of the wave reflector was compared with the amounts of reflected waves of the first and second wave absorbers, and the wave return loss of each of the first and second wave absorbers based on the amount of reflected waves of the wave reflector was calculated. The result thus obtained indicated the wave absorbing capabilities.

Figure 10:
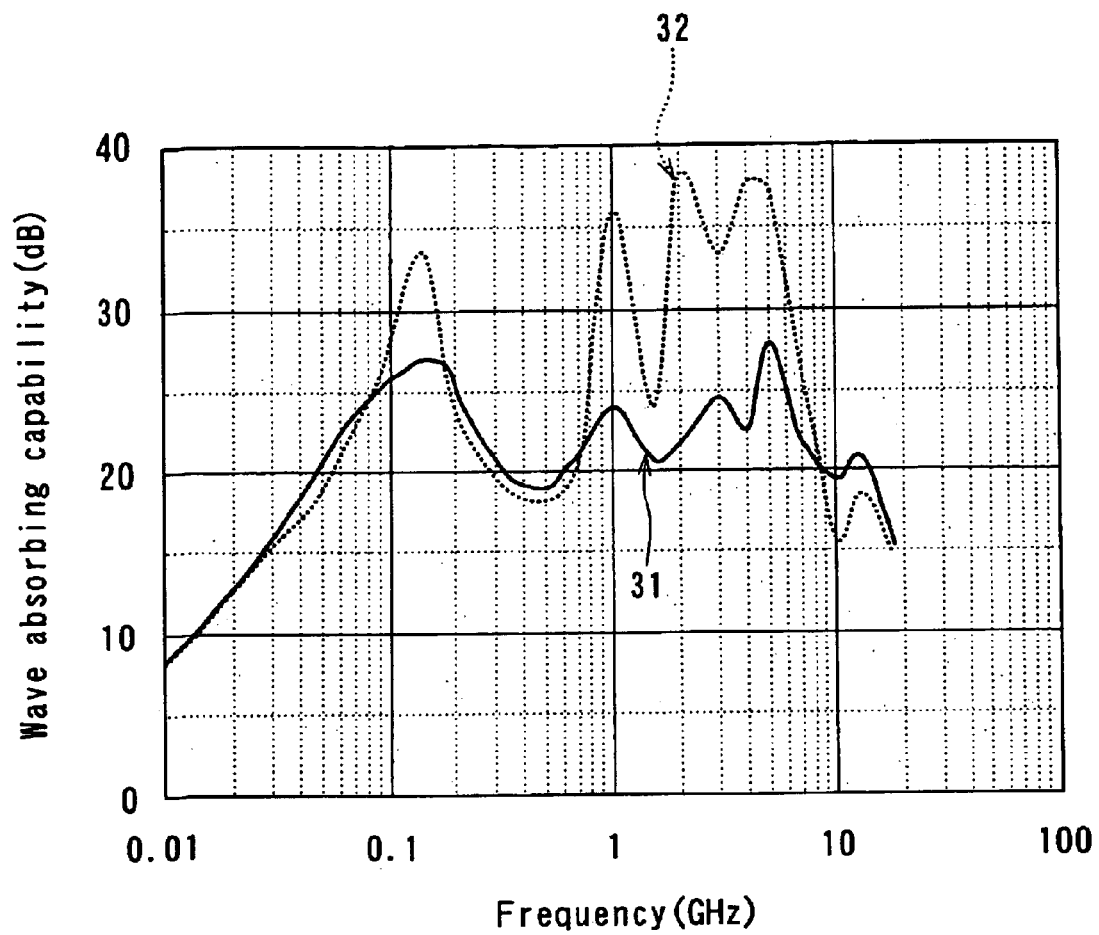
FIG. 10 is a plot showing electromagnetic wave absorbing capabilities of two types of wave absorbers of the embodiment of the invention.

FIG. 10 shows the result of evaluation of the wave absorbing capabilities of the first and second wave absorbers. In FIG. 10 the horizontal axis indicates frequencies while the vertical axis indicates the wave absorbing capabilities. The line indicated with numeral 31 represents the wave absorbing capability of the first wave absorber. The line indicated with numeral 32 represents the wave absorbing capability of the second wave absorber. As shown in FIG. 10, the first and second wave absorbers both have excellent wave absorbing capabilities. The wedge-shaped apex portion 22 contains more ferrite per unit length taken along the height of the apex, compared to the pyramid-shaped apex portion 12. Therefore, the second molded element 20 has a height lower than that of the first molded element 10. It is thus noted that the wedge-shaped molded element 20 is preferred to the pyramid-shaped molded element 10 so as to reduce the height of the apex portion and thereby reduce the size of the wave absorber.

Next, the preferred range of proportion of ferrite in the wave absorber molding materials was obtained as follows. The three types of molding materials having mix proportions 1, 2 and 4 were utilized to make three types of wedge-shaped wave absorber molded elements 20. Next, plate-shaped sintered ferrite and a metal plate were joined to each of the three-types of molded elements 20 to fabricate three-types of wave absorbers. The wave absorbing capabilities of these wave absorbers were evaluated. The evaluation method is described above.

Figure 11:
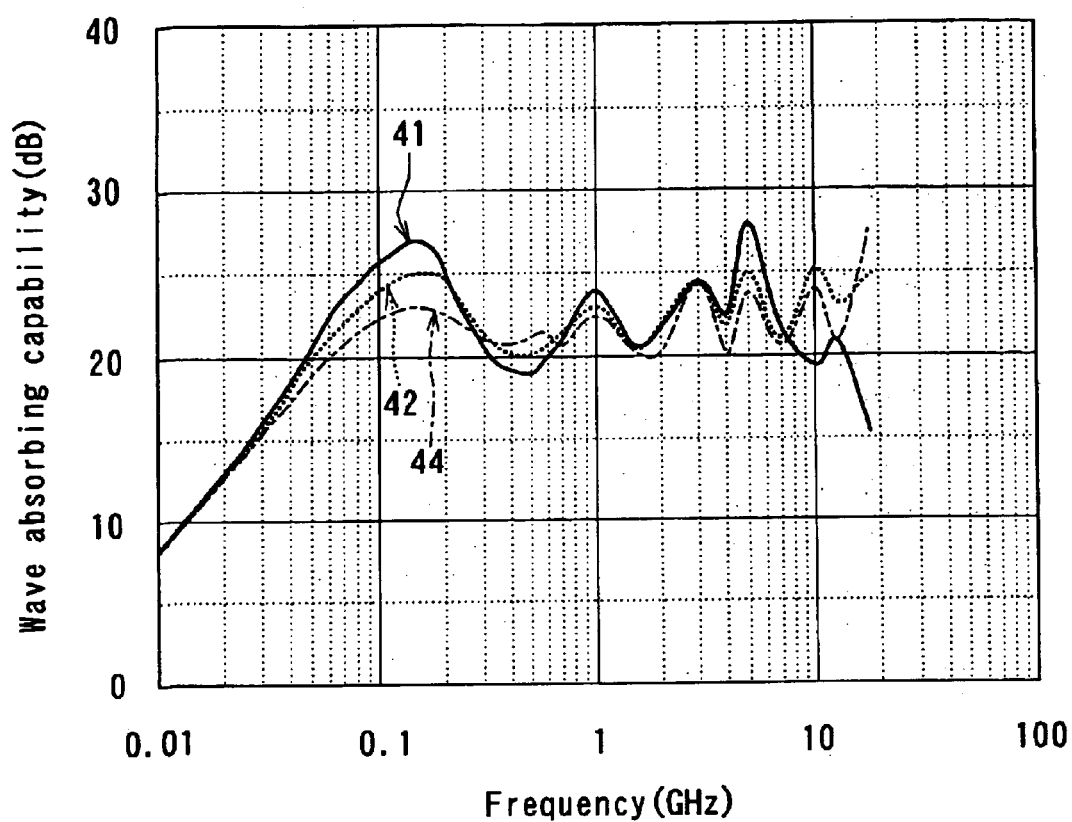
FIG. 11 is a plot showing electromagnetic wave absorbing capabilities of three types of wave absorbers of the embodiment of the invention.

FIG. 11 shows the result of evaluation of the wave absorbing capabilities of the above-mentioned three types of wave absorbers. In FIG. 11 the horizontal axis indicates frequencies while the vertical axis indicates the wave absorbing capabilities. The lines indicated with numerals 41, 42 and 44 represent the wave absorbing capabilities of the wave absorbers including the molded elements 20 made of the molding materials having mix proportions 1, 2 and 4, respectively.

As shown in FIG. 11, each of the three types of wave absorbers has an excellent wave absorbing capability. In particular, as indicated by the line 42, the wave absorber including the molded elements 20 made of the molding material having mix proportion 2 has a wave absorbing capability of 15 dB or greater at a frequency of 30 MHz, and has a wave absorbing capability of 20 dB or greater in a wide band from 50 MHz to 18 GHz. It is the proportion of ferrite powder in the wave absorber molding material that contributes to the wave absorbing capability. As shown in FIG. 11, it was confirmed that it is possible to form a wave absorber suitable for use in anechoic chambers when the proportion of ferrite powder in the material falls within the range of 80 to 90 weight % inclusive. As shown in FIG. 11, the proportion of ferrite powder is more preferably 85 weight % inclusive.

As described so far, the wave absorber molding material of the embodiment is made up of ferrite powder as a magnetic material, inorganic fibers and an inorganic binder, and does not contain any organic material. Therefore, the molding material exhibits high refractoriness and non-flammability. It is thus possible to manufacture a wave absorber molded element having non-flammability through the use of the molding material.

The wave absorber molding material of the embodiment first has fluidity when mixed with water, and exhibits a curing reaction in a temperature range of 1 to 40° C. inclusive. Therefore, it is possible to mix the molding material with water to be in a fluid state and inject the material into a mold to cure so as to manufacture the wave absorber molded element easily without the steps of pressing or sintering that require large-scale facilities.

Furthermore, the wave absorber molding material of the embodiment is utilized so as to easily manufacture the wave absorber molded element having a shape and a size that are appropriate. It is thereby possible to form a small-sized wave absorber molded element while the wave absorber obtains a desired wave absorbing capability.

As thus described, the embodiment achieves the manufacture of the wave absorber that is non-flammable, small-sized and suitable for use in anechoic chambers.

The present invention is not limited to the foregoing embodiment but may be practiced in still other ways. For example, the materials making up the wave absorber molding material are not limited to those illustrated in the embodiment but may be other materials. In addition, although the wave absorber is made up of the molded element, the plate-shaped wave absorbing section and the wave reflector, the wave absorber may be made up of the molded element only.

According to the electromagnetic wave absorber molding material, the wave absorber molded element or the method of manufacturing the same, or the wave absorber of the invention described so far, it is possible to easily manufacture the non-flammable and small-sized wave absorber.

Obviously many modifications and variations of the present invention are possible in the light of the above teachings. It is therefore to be understood that within the scope of the appended claims the invention may be practiced otherwise than as specifically described.

What is claimed is:

1. An electromagnetic wave absorber molded element made of a molding material and making up at least part of a wave absorber, wherein
    the molding material includes a magnetic material, an inorganic fiber and an inorganic binder, and
    the molding material first exhibits fluidity when the magnetic material, the inorganic fiber and the inorganic binder are mixed with water, and then exhibits a curing reaction in a temperature range of approximately 1 to 40° C. inclusive, the molded element having such a shape that a proportion of the molded element occupying a space of unit volume increases from a wave-incident-side end of the element to the other end.

2. The molded element according to claim 1, being wedge-shaped or pyramid-shaped.

3. An electromagnetic wave absorber molding material used for making a molded element making up at least part of an electromagnetic wave absorber, the molding material including a magnetic material, an inorganic fiber and an inorganic binder, the molding material first exhibiting fluidity when the magnetic material, the inorganic fiber and the inorganic binder are mixed with water, and then exhibiting a curing reaction in a temperature range of approximately 1 to 40° C. inclusive, wherein a proportion of the inorganic binder in the molding material falls within a range of approximately 8.0 to 13.0 weight % inclusive.

4. An electromagnetic wave absorber molding material used for making a molded element making up at least part of an electromagnetic wave absorber, the molding material including a magnetic material, an inorganic fiber and an inorganic binder, the molding material first exhibiting fluidity when the magnetic material, the inorganic fiber and the inorganic binder are mixed with water, and then exhibiting a curing reaction in a temperature range of approximately 1 to 40° C. inclusive, wherein the inorganic fiber has a length in a range of approximately 20 to 150 μm inclusive, and a proportion of the inorganic fiber in the molding material falls within a range of approximately 2.0 to 7.0 weight % inclusive.

5. An electromagnetic wave absorber molding material used for making a molded element making up at least part of an electromagnetic wave absorber, the molding material including a magnetic material, an inorganic fiber and an inorganic binder, the molding material first exhibiting fluidity when the magnetic material, the inorganic fiber and the inorganic binder are mixed with water, and then exhibiting a curing reaction in a temperature range of approximately 1 to 40° C. inclusive, wherein a proportion of the magnetic material in the molding material falls within a range of approximately 80 to 90 weight % inclusive.

6. An electromagnetic wave absorber molding material used for making a molded element making up at least part of an electromagnetic wave absorber, the molding material including a magnetic material, an inorganic fiber and an inorganic binder, the molding material first exhibiting fluidity when the magnetic material, the inorganic fiber and the inorganic binder are mixed with water, and then exhibiting a curing reaction in a temperature range of approximately 1 to 40° C. inclusive, wherein the inorganic binder includes soluble alkaline silicate and zinc borate.

7. An electromagnetic wave absorber molded element made of a molding material and making up at least part of a wave absorber, wherein
the molding material includes a magnetic material, an inorganic fiber and an inorganic binder,
the molding material first exhibits fluidity when the magnetic material, the inorganic fiber and the inorganic binder are mixed with water, and then exhibits a curing reaction in a temperature range of approximately 1 to 40° C. inclusive, and
the inorganic binder includes soluble alkaline silicate and zinc borate.

8. An electromagnetic wave absorber molded element made of a molding material and making up at least part of a wave absorber, wherein
the molding material includes a magnetic material, an inorganic fiber and an inorganic binder,
the molding material first exhibits fluidity when the magnetic material, the inorganic fiber and the inorganic binder are mixed with water, and then exhibits a curing reaction in a temperature range of approximately 1 to 40° C. inclusive, and
a proportion of the inorganic binder in the molding material falls within a range of approximately 8.0 to 13.0 weight % inclusive.

9. An electromagnetic wave absorber molded element made of a molding material and making up at least part of a wave absorber, wherein
the molding material includes a magnetic material, an inorganic fiber and an inorganic binder,
the molding material first exhibits fluidity when the magnetic material, the inorganic fiber and the inorganic binder are mixed with water, and then exhibits a curing reaction in a temperature range of approximately 1 to 40° C. inclusive, and
the inorganic fiber has a length in a range of 20 to 150 μm inclusive, and a proportion of the inorganic fiber in the molding material falls within a range of approximately 2.0 to 7.0 weight % inclusive.

10. An electromagnetic wave absorber molded element made of a molding material and making up at least part of a wave absorber, wherein
the molding material includes a magnetic material, an inorganic fiber and an inorganic binder,
the molding material first exhibits fluidity when the magnetic material, the inorganic fiber and the inorganic binder are mixed with water, and then exhibits a curing reaction in a temperature range of approximately 1 to 40° C. inclusive, and
a proportion of the magnetic material in the molding material falls within a range of approximately 80 to 90 weight % inclusive.

11. An electromagnetic wave absorber molded element made of a molding material and making up at least part of a wave absorber, wherein
the molding material includes a magnetic material, an inorganic fiber and an inorganic binder, and
the molding material first exhibits fluidity when the magnetic material, the inorganic fiber and the inorganic binder are mixed with water, and then exhibits a curing reaction in a temperature range of approximately 1 to 40° C. inclusive, the molded element having a surface to which coating is applied.

12. A method of manufacturing an electromagnetic wave absorber molded element made of a molding material and making up at least part of an electromagnetic wave absorber, wherein
the molding material includes a magnetic material, an inorganic fiber and an inorganic binder, and
the molding material first exhibits fluidity when the magnetic material, the inorganic fiber and the inorganic binder are mixed with water, and then exhibits a curing reaction in a temperature range of approximately 1 to 40° C. inclusive,
the method comprising the steps of:
injecting slurry into a mold, the slurry being obtained through mixing the molding material with water;
curing the slurry injected into the mold to form the molded element; and
taking the molded element out of the mold.

13. The method according to claim 14, wherein the inorganic binder includes soluble alkaline silicate and zinc borate.

14. The method according to claim 14, wherein a proportion of the inorganic binder in the molding material falls within a range of approximately 8.0 to 13.0 weight % inclusive.

15. The method according to claim 14, wherein the inorganic fiber has a length in a range of 20 to 150 μm inclusive, and a proportion of the inorganic fiber in the molding material falls within a range of approximately 2.0 to 7.0 weight % inclusive.

16. The method according to claim 14, wherein a proportion of the magnetic material in the molding material falls within a range of approximately 80 to 90 weight % inclusive.

17. The method according to claim 14, wherein the molded element is formed to have such a shape that a proportion of the molded element occupying a space of unit volume increases from a wave-incident-side end of the element to the other end.

18. The method according to claim 17, wherein the molded element is formed to be wedge-shaped or pyramid-shaped.

19. The method according to claim 14, wherein the molded element has a surface to which coating is applied.

20. An electromagnetic wave absorber comprising:
a wave absorber molded element made of a molding material and making up part of the wave absorber;
a plate-shaped wave absorbing section having surfaces one of which is located adjacent to an end of the molded element opposite to a wave-incident side; and
a wave reflector located adjacent to the other one of the surfaces of the wave absorbing section, wherein
the molding material includes a magnetic material, an inorganic fiber and an inorganic binder, and
the molding material first exhibits fluidity when the magnetic material, the inorganic fiber and the inorganic binder are mixed with water, and then exhibits a curing reaction in a temperature range of approximately 1 to 40° C. inclusive.

21. The wave absorber according to claim 20, wherein the inorganic binder includes soluble alkaline silicate and zinc borate.

22. The wave absorber according to claim 20, wherein a proportion of the inorganic binder in the molding material falls within a range of approximately 8.0 to 13.0 weight % inclusive.

23. The wave absorber according to claim 20, wherein the inorganic fiber has a length in a range of approximately 20 to 150 μm inclusive, and a proportion of the inorganic fiber in the molding material falls within a range of approximately 2.0 to 7.0 weight % inclusive.

24. The wave absorber according to claim 20, wherein a proportion of the magnetic material in the molding material falls within a range of approximately 80 to 90 weight % inclusive.

25. The wave absorber according to claim 20, wherein the molded element has such a shape that a proportion of the molded element occupying a space of unit volume increases from wave-incident-side end of the element to the other end.

26. The wave absorber according to claim 25, wherein the molded element is wedge-shape or pyramid-shaped.

27. The wave absorber according to claim 20, wherein the molded element has a surface to which coating is applied.

28. The wave absorber according to claim 20, wherein the wave absorbing section is made of sintered ferrite.

* * * * *